(12) United States Patent
Borland et al.

(10) Patent No.: US 7,430,128 B2
(45) Date of Patent: Sep. 30, 2008

(54) CAPACITIVE/RESISTIVE DEVICES, ORGANIC DIELECTRIC LAMINATES AND PRINTED WIRING BOARDS INCORPORATING SUCH DEVICES, AND METHODS OF MAKING THEREOF

(75) Inventors: William J. Borland, Cary, NC (US); G. Sidney Cox, Durham, NC (US); David Ross McGregor, Apex, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 326 days.

(21) Appl. No.: 10/967,541

(22) Filed: Oct. 18, 2004

(65) Prior Publication Data

US 2006/0082980 A1    Apr. 20, 2006

(51) Int. Cl.
*H05K 1/16* (2006.01)
(52) U.S. Cl. ............... 361/766; 361/763; 361/765
(58) Field of Classification Search .......... 361/760–766
See application file for complete search history.

(56) References Cited

U.S. PATENT DOCUMENTS

| | | | |
|---|---|---|---|
| 3,934,119 A | 1/1976 | Trenkler | |
| 4,302,737 A | 11/1981 | Kausche et al. | |
| 4,377,652 A | 3/1983 | Ohmura et al. | |
| 4,407,883 A | 10/1983 | Newton | |
| 4,410,867 A * | 10/1983 | Arcidiacono et al. | 333/172 |
| 4,508,766 A | 4/1985 | Inaike et al. | |
| 4,752,555 A | 6/1988 | Takada et al. | |
| 5,093,036 A | 3/1992 | Shafe et al. | |
| 5,284,899 A | 2/1994 | Morishige et al. | |
| 5,354,695 A * | 10/1994 | Leedy | 438/411 |
| 5,470,643 A | 11/1995 | Dorfman | |
| 5,731,747 A | 3/1998 | Van De Walle et al. | |
| 6,030,553 A | 2/2000 | Huang et al. | |
| 6,111,005 A | 8/2000 | Dietz et al. | |
| 6,140,402 A | 10/2000 | Dietz et al. | |
| 6,197,222 B1 | 3/2001 | Saraf et al. | |
| 6,278,356 B1 | 8/2001 | Lin et al. | |
| 6,285,542 B1 | 9/2001 | Kennedy, III et al. | |
| 6,356,455 B1 * | 3/2002 | Carpenter | 361/793 |
| 6,541,137 B1 * | 4/2003 | Kingon et al. | 428/701 |
| 6,600,645 B1 | 7/2003 | Lauf et al. | |
| 6,707,682 B2 * | 3/2004 | Akiba et al. | 361/763 |

(Continued)

FOREIGN PATENT DOCUMENTS

EP    0 409 668 A2    1/1991

(Continued)

*Primary Examiner*—Tuan T Dinh

(57) ABSTRACT

This invention relates to a capacitive/resistive device, which may be embedded within a layer of a printed wiring board. Embedding the device conserves board surface real estate, and reduces the number of solder connections, thereby increasing reliability. More specifically, the device, comprises a first metallic foil; a second metallic foil; a first electrode formed from the first metallic foil; a dielectric disposed over the first electrode, a resistor element formed on and adjacent to the dielectric; a conductive trace; and a second electrode formed from the second metallic foil and disposed over the dielectric and in electrical contact with the resistor element, wherein the dielectric is disposed between the first electrode and the second electrode and wherein said dielectric comprises an unfilled polymer of dielectric constant less than 4.0. This invention also relates to a method of making the device.

1 Claim, 4 Drawing Sheets

U.S. PATENT DOCUMENTS 6,872,893 B2 * 3/2005 Fukuoka et al. ............. 174/255
2004/0128822 A1 7/2004 Tung

FOREIGN PATENT DOCUMENTS

| | | | |
|---|---|---|---|
| EP | 0 636 229 | A2 | 4/1998 |
| EP | 0918339 | A2 | 5/1999 |
| JP | 7-226302 | | 8/1995 |

* cited by examiner

CAPACITIVE/RESISTIVE DEVICES, ORGANIC DIELECTRIC LAMINATES AND PRINTED WIRING BOARDS INCORPORATING SUCH DEVICES, AND METHODS OF MAKING THEREOF

BACKGROUND

The technical field relates to devices having both a capacitive and resistive functions, and methods of incorporating such devices in organic dielectric laminates and printed wiring boards.

Capacitors and resistors may be used in series for transmission line termination of signal traces extending between integrated circuit (IC) devices. The capacitors and resistors are used to match the impedance of an IC device to a line, or to reduce or eliminate signal reflection. Some circuits are continuous load and use a resistor in parallel with the line. Non-continuous load circuits have a resistor and capacitor in series and are useful for low power ICs. FIG. 1 schematically illustrates a non-continuous load termination of IC devices 10 and 20.

In FIG. 1, the distance from a to b is typically short. The value of the resistor R is chosen to match the line impedance and is typically about 45-80 ohms. The value of the capacitor C is chosen so that the RC time constant of the resistor R and the capacitor C in series is greater than the rise time of a signal and less than the total time of the signal pulse. Typical capacitance values are on the order of 30 picoFarads.

Conventional RC terminations are typically constructed of a surface mount technology (SMT) resistor and capacitor. FIG. 2 is a cross section view of a portion of a printed circuit board 25 having a SMT resistor 40 and a SMT capacitor 50 connected to an IC device 30 to form a conventional SMT RC transmission line termination for the IC 30. The signal line carrying the signal to the IC 30 is connected to a circuit trace 60 connecting the IC device 30 to the resistor 40. The capacitor 50 is coupled to a circuit trace 70 by one of a pair of solder pads 52 and solder joints 58. The resistor 40 is coupled to the circuit trace 70 by a solder pad 42 and a solder joint 48. The capacitor 50 is coupled to a via hole 80 by the other solder pad 58 and a circuit trace 59. This arrangement places the resistor 40 and the capacitor 50 in series with the signal line and connected to ground through a plated through-hole via 80. This conventional surface mount approach requires use of valuable surface real estate. Further, the requirement for solder joints reduces reliability and increases costs of fabrication.

SUMMARY OF THE INVENTION

According to a first embodiment, a capacitive/resistive device comprises a first electrode, a dielectric disposed over the first electrode, a resistor element disposed over a second electrode and adjacent to the dielectric wherein said dielectric comprises an unfilled polymer of dielectric constant less than 4.0. The capacitive/resistive device can be embedded in organic dielectric laminates, and incorporated in printed wiring boards.

According to the above embodiment, both the resistor and the capacitor functions may be integrated into a single buried laminate, reducing the cost and difficulty in creating the resistor and capacitor functions. When the capacitive/resistive device is incorporated in a printed wiring board, embedding the capacitive/resistive device also frees up valuable real estate. Further, solder joints associated with SMT devices may be eliminated, thereby improving reliability. The capacitive/resistive device can be processed using conventional etching processes, further reducing production costs.

Those skilled in the art will appreciate the above stated advantages and other advantages and benefits of various additional embodiments of the invention upon reading the following detailed description of the embodiments.

BRIEF DESCRIPTION OF THE DRAWINGS

The detailed description will refer to the following drawings, wherein like numerals refer to like elements, and wherein.

DETAILED DESCRIPTION

Embodiments of the present invention are addressed to capacitive/resistive devices that may be buried in the substrate of a printed wiring board (PWB). Providing the capacitive and resistive functions within the PWB substrate conserves valuable surface real estate on the printed wiring board. The embodiments of the present invention also require fewer solder joints than conventional SMT termination arrangements.

Figure 1:
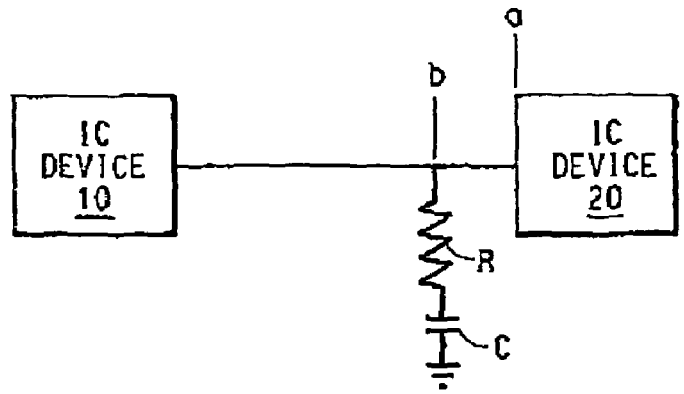
FIG. 1 is a schematic illustration of a conventional (prior art) non-continuous load termination having a resistor and capacitor in series.
Figure 2:
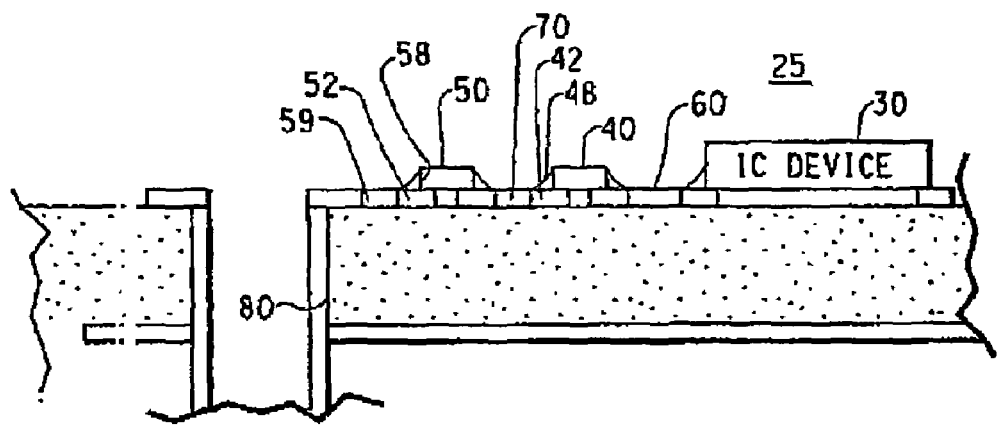
FIG. 2 is a cross section view of a printed wiring board having a conventional (prior art) SMT RC transmission line termination for an integrated circuit device.
Figure 3:
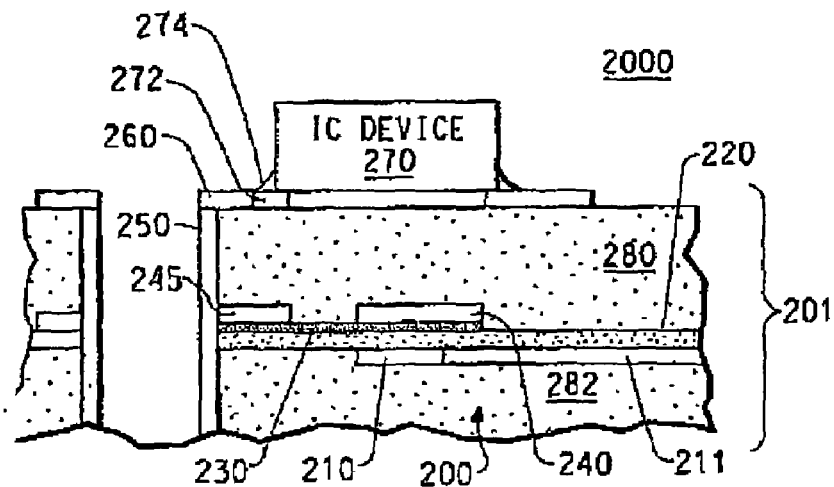
FIG. 3 is a section view of a portion of a printed wiring board having an embedded capacitive/resistive device.

FIG. 3 is a section view of a portion of a printed wiring board 2000. The printed wiring board section 2000 includes an RC transmission line termination in which the resistor function and the capacitor function are integrated into a single capacitive/resistive device 200. The device 200 comprises a bottom electrode 210, a dielectric 220, a resistor element 230, a top electrode or top plate 240, and a conductive trace 245. The device 200 provides a resistive and a capacitive function in a single laminate structure, generally indicated by the bracket 201. The device 200 is coupled to an IC device 270 by the conductive circuit trace 245, a plated through hole via 250 extending through a dielectric layer 280, and a conductive circuit trace 260. The IC device 270 may be connected to the conductive circuit trace 260 by a solder pad 272 and a solder joint 274. A conductive circuit trace 211 may extend from the bottom electrode 210 for connection to other circuitry.

Figure 4A:
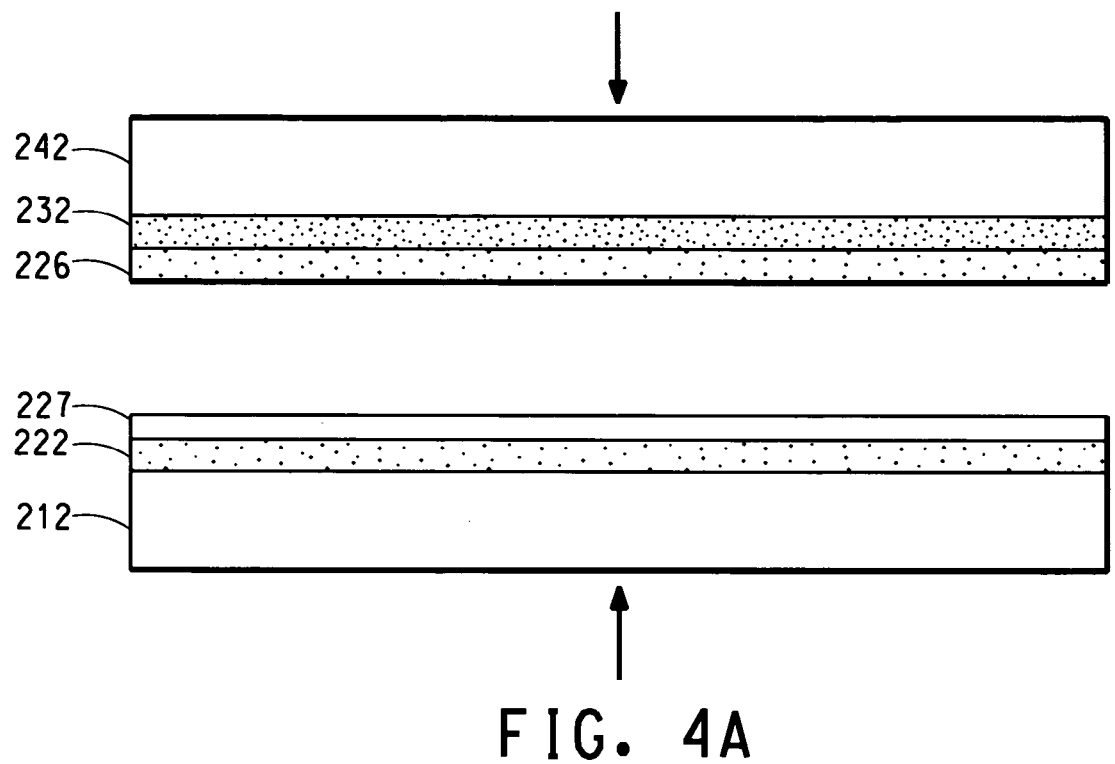
FIGS. 4A-4F illustrate a method of making a laminate structure including the capacitive/resistive device illustrated in FIG. 3.

FIGS. 4A-4F illustrate a method of making a laminate including the device 200. FIG. 4A is a section view in front elevation of a first stage of manufacture in which first and second metallic foils 212, 242 are provided. The second metallic foil 242 is provided with a layer of resistor material 232. The resistor material 232 can be, for example, NiP, CrSi, NiCr or other electrically resistive materials that can be plated or sputtered over the surface of the second metallic foil 242. The first and second metallic foils 212, 242 can be made from, for example, copper, copper-based materials, and other metals.

A polymer solution may be cast or coated onto the first foil 212 and cured, forming a first dielectric layer 222. A similar, second dielectric layer 226 may be formed in a similar manner on the second foil 242, over the surface of the layer of resistor material 232. The polymer solution may be formed from, for example, epoxy, polyimide or other resins in a suitable solvent.

A thin adhesive layer 227 may be applied to one or both surfaces of either of the dielectric layers 222, 226 (shown in FIG. 4A on the layer 222). The adhesive layer 227 may be formed from, for example, a thermoplastic polymer. The two structures are then laminated together in the direction of the arrows shown in FIG. 4A.

Figure 4B:
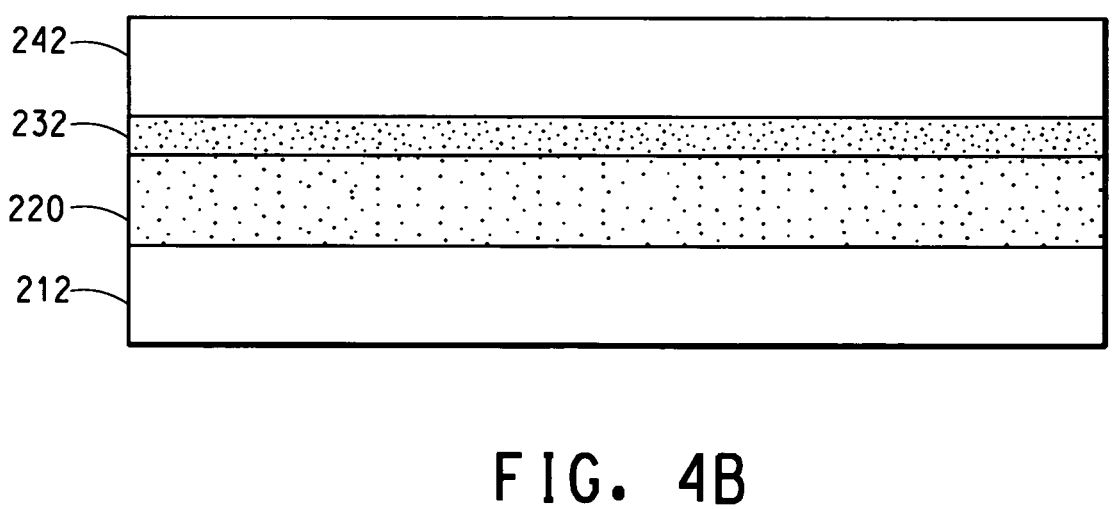

Referring to FIG. 4B, lamination forms a single dielectric 220 from the layers 222, 226 and 227. The adhesive layer 227 facilitates joining of the dielectric layers 222 and 226 during the lamination process. The adhesive layer 227, however, may be dispensed with if the dielectric layers 222 and 226 are only partially cured prior to lamination, or, are of a thermoplastic nature so that upon lamination a suitable temperature and pressure will sufficiently soften the resin so that the layers 224 and 226 bond without adhesive. The structure shown in FIG. 4B may also be formed by casting a polymer solution onto only one of the foils 212, 242 and laminating the other foil to the cast polymer solution. Yet another alternative method would be to form a free-standing film of the polymer 220 and laminate foils 212 and 242 to both sides of the polymer film 220.

Figure 4C:
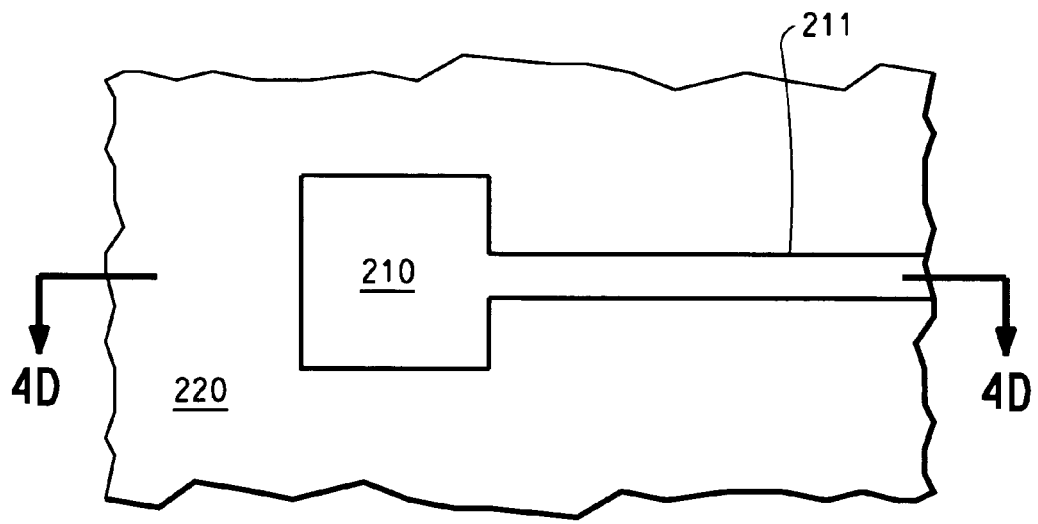

A photoresist (not shown in FIG. 4B) is applied to the foil 212 and the photoresist is imaged and developed. The foil 212 is then etched, and the remaining photoresist stripped using standard printing wiring board processing conditions. FIG. 4C is a bottom section view of the resulting article, taken on line 4C-4C in FIG. 4D. Referring to FIG. 4C, the etching produces the bottom electrode 210 of the device 200 and the conductive circuit trace 211.

Figure 4D:
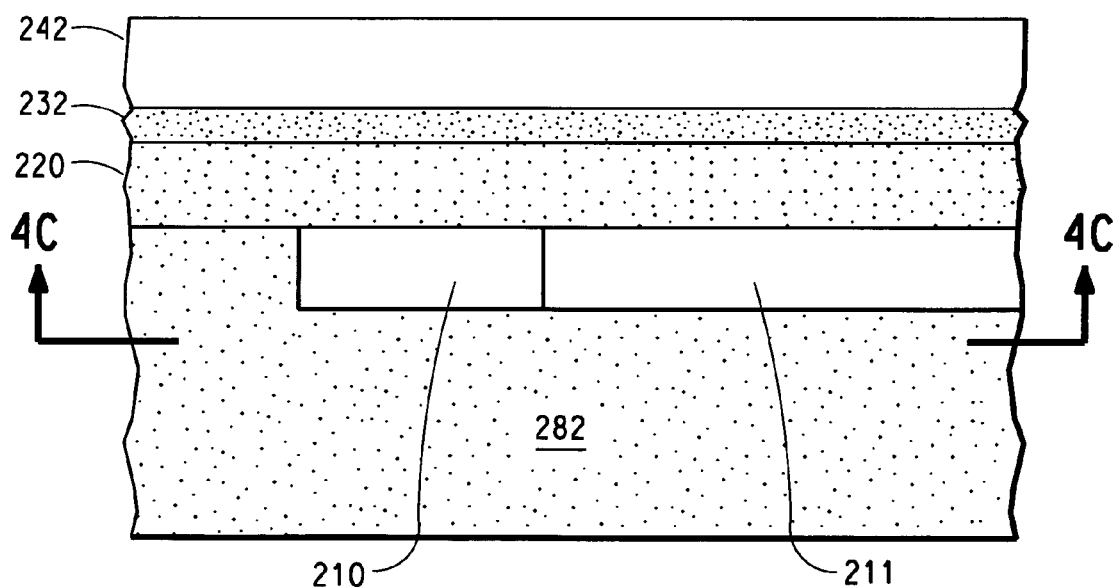

FIG. 4D is a section view in front elevation taken on line 4D-4D in FIG. 4C. Referring to FIG. 4D, the bottom electrode 210 side of the resulting article is laminated to a laminate material 282. The lamination can be performed, for example, using FR4 prepreg, or other prepregs, in standard printing wiring board processes.

Figure 4E:
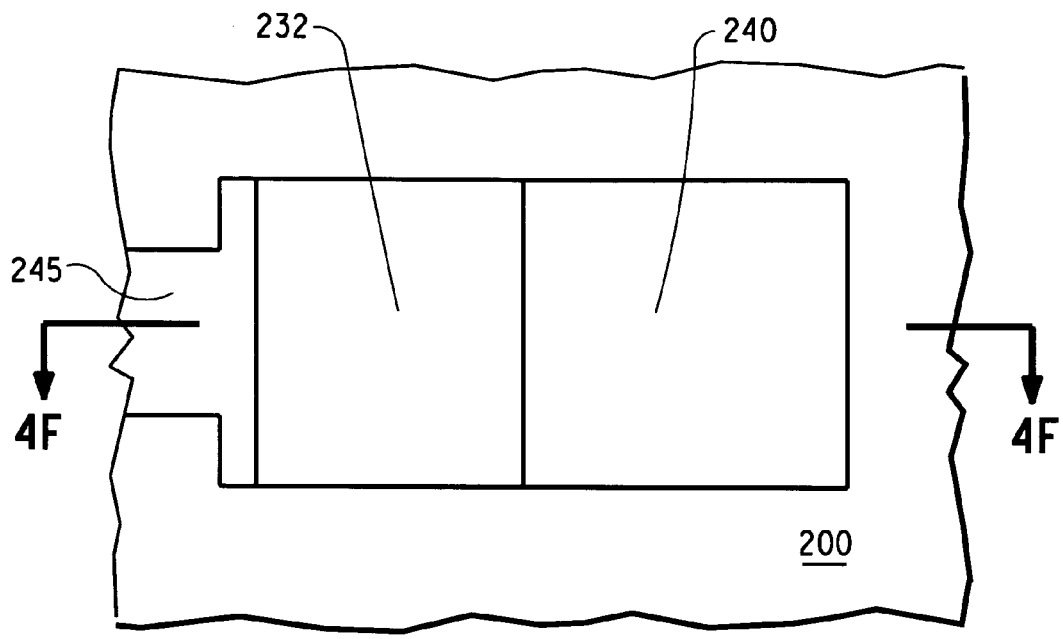
Figure 4F:
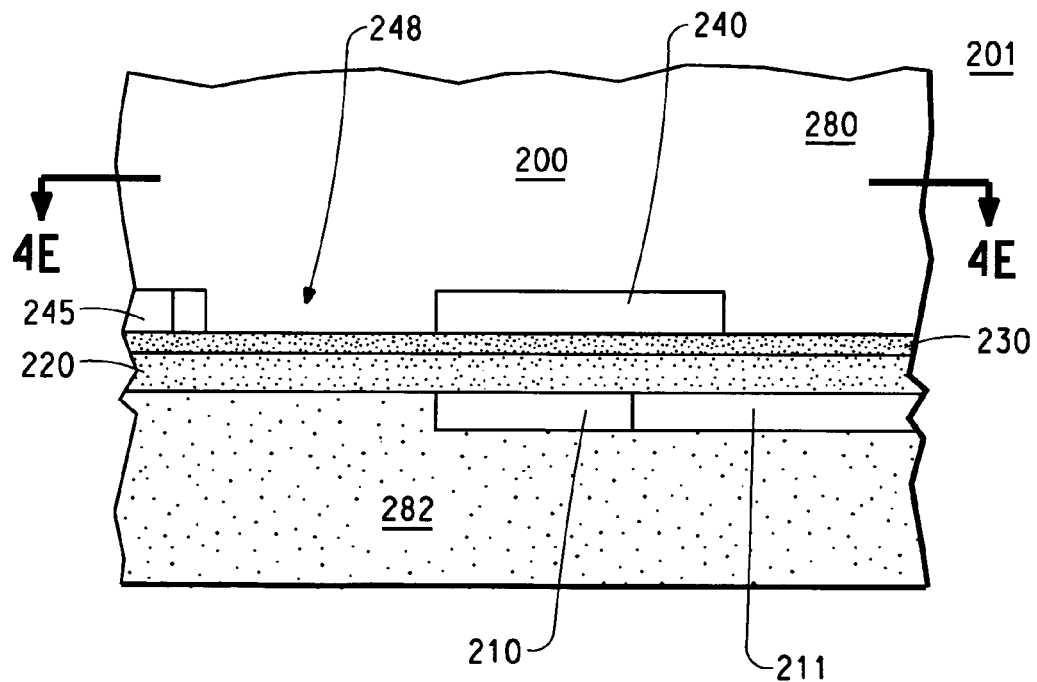

A photoresist (not shown in FIG. 4D) is applied to the foil 242 and the photoresist is imaged and developed. The foil 242 is etched, then the resistor layer 232 is etched and the remaining photoresist stripped. FIG. 4E is a top section view of the resulting article, taken on line 4E-4E in FIG. 4F. FIG. 4F is a section view in front elevation, taken on line 4F-4F in FIG. 4E. Referring to FIGS. 4E and 4F, the etching produces the top electrode 240 of the device 200 and the conductive circuit trace 245. Etching images the foil 242 and the resistor layer 232.

A photoresist (not shown in FIGS. 4E and 4F) may be applied to the imaged foil and resistor. The photoresist is imaged and developed and the foil 242 is then etched using etching solutions that remove foil, but not resistor material. The remaining photoresist is then stripped. In this way, the layer of resistor material 232 can be selectively imaged to form a resistor element 230 having any desired shape and dimensions. The resultant resistor element 230 bridges the gap 248 and extends between the top conductor 240 and the conductive trace 245.

Referring to FIG. 4F, a dielectric layer 280 is laminated to the component side of the dielectric layer 282, forming a laminate structure 201. The laminate structure 201 can then be incorporated into, for example, a printed wiring board using conventional lamination and via formation processes.

EXAMPLE

This example of the device 200 is discussed with reference to FIG. 3. In this example, the electrodes 210, 240 are formed from copper foils. Resistive material 230 is a plated nickel phosphorus alloy of sheet resistivity 50 ohms per square. The dielectric 220 is an unfilled polyimide dielectric (IN-TERRA™ HK 04, available from DuPont Electronic Technologies, Wilmington, Del.) of 25 microns thickness having a dielectric constant of 3.5 thereby giving a capacitance density of 800 picoFarads per square inch.

The size (when viewed from a top plan perspective) of the capacitor needed for a transmission line termination of 30 picoFarad is 24.2 square mm, which corresponds to slightly less than 5 mm by 5 mm.

The size of the resistor in this example for a nominal 60 ohm resistance can be varied, as long as the length to width ratio is maintained at 1.2 to 1.0. The above capacitor is easy to make to relatively high tolerances.

According to the above embodiment, thin capacitor laminate structures in combination with resistors may be used to effectively bury RC transmission line terminations. Embedding the capacitor and resistor functions frees up valuable board surface real estate and eliminates solder joints associated with SMT devices, thereby improving reliability. Further, the laminates combining resistance and capacitance within the laminate can be processed using conventional etching processes, which reduces production costs.

The above embodiments also provide other options for circuit designers and PWB fabricators. For example, one piece of laminate can be used to embed many discrete resistors and many discrete capacitors, which reduces the inductance associated with connecting resistors and capacitors.

The shapes of the capacitor embodiments in top plan view are generally rectangular. However, the capacitor electrodes, dielectrics, and other components and layers can have other regular or irregular surface area shapes, such as, for example, round, oblong, oval or polygonal shapes.

A single capacitive/resistive device 200 is formed in the laminate structures 201 described above. However, panel structures and printed wiring boards can include a large number of individual capacitive/resistive devices of differing type and arrangement.

In the above embodiments, resistance, capacitance and inductance combine to create a specific circuit impedance, typically identified by the capital letter Z. The resistance and capacitance may be structured to achieve a specific impedance. Changing the resistance, capacitance, or both will change the inductance. All three changes can be controlled to define the final impedance. In other words, the impedance of the laminate is 'tunable.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

The invention claimed is:

1. A capacitive/resistive device, comprising:
   (i) a first metallic foil;
   (ii) a second metallic foil;
   (iii) a capacitor dielectric layer disposed over the first metallic foil;
   (iv) a resistive layer disposed over the second metallic foil and adjacent to the capacitor dielectric layer;
   (v) a first capacitor electrode formed from the first metallic foil;
   (vi) a second capacitor electrode and a conductive trace formed from the second metallic foil;
   wherein the first capacitor electrode, the second capacitor electrode, and the capacitor dielectric layer form a capacitor;
   (vii) a resistor element formed from the resistive layer;
   wherein the resistor element extends between the conductive trace and the second capacitor electrode to form a terminated resistor in series with the capacitor; and
   wherein the first capacitor electrode, the second capacitor electrode, and the resistor element are formed by selective imaging and etching to form specific values of capacitance and resistance respectively to achieve a specific circuit impedance;
   wherein the capacitor dielectric layer has a dielectric constant of less than 4.0; and
   wherein the capacitor and the terminated resistor are embedded within at least two printed wiring board dielectric laminate layers.

* * * * *

UNITED STATES PATENT AND TRADEMARK OFFICE
CERTIFICATE OF CORRECTION

PATENT NO.       : 7,430,128 B2
APPLICATION NO.  : 10/967541
DATED            : September 30, 2008
INVENTOR(S)      : Borland et al.

It is certified that error appears in the above-identified patent and that said Letters Patent is hereby corrected as shown below:

Title Page, item (57), under "Abstract", in Column 2, Line 8, delete "electrode," and insert -- electrode; --.

Title Page 2, item (56), under "Foreign Patent Documents", in Column 1, Line 1, delete "EP 0 636 229 A2 4/1998" and insert -- EP 0 836 229 A2 4/1998 --.

Signed and Sealed this
Third Day of April, 2012

David J. Kappos
*Director of the United States Patent and Trademark Office*